(12) United States Patent
Aboush et al.

(10) Patent No.: US 8,187,922 B2
(45) Date of Patent: May 29, 2012

(54) LOW COST FLEXIBLE SUBSTRATE

(75) Inventors: Zaid Aboush, Cambridgeshire (GB); Peter John Robinson, Cambridgeshire (GB)

(73) Assignee: Cambridge Silicon Radio Ltd. (GB)

( * ) Notice: Subject to any disclaimer, the term of this patent is extended or adjusted under 35 U.S.C. 154(b) by 124 days.

(21) Appl. No.: 12/557,896

(22) Filed: Sep. 11, 2009

(65) Prior Publication Data

US 2010/0078800 A1  Apr. 1, 2010

(30) Foreign Application Priority Data

Sep. 30, 2008 (GB) .................................. 0817834.5

(51) Int. Cl.
  *H01L 21/00* (2006.01)
(52) U.S. Cl. ........ 438/117; 438/106; 438/121; 438/123; 438/E23.06; 438/E21.502
(58) Field of Classification Search .......... 257/734–786, 257/E23.01–E23.079, E23.141–E23.179, 257/E23.015, E23.02, E23.023, 686, 690, 257/692, E23.103, E23.189, E21.026, E21.148, E21.259, E21.492; 438/117, 121, 123, 106, E23.06, E21.502; 174/254; 428/98.4
See application file for complete search history.

(56) References Cited

U.S. PATENT DOCUMENTS

| 5,585,162 A | * | 12/1996 | Schueller | ................... 428/131 |
| 6,265,783 B1 | * | 7/2001 | Juso et al. | ................... 257/786 |
| 6,281,107 B1 | * | 8/2001 | Moriyama | ................... 438/613 |
| 2008/0315439 A1 | * | 12/2008 | Shen et al. | ................... 257/783 |

FOREIGN PATENT DOCUMENTS

JP  8-335607  * 12/1996

* cited by examiner

*Primary Examiner* — Jasmine Clark
(74) *Attorney, Agent, or Firm* — Greenberg Traurig, LLP

(57) ABSTRACT

A low cost flexible substrate is described which comprises a thin metal foil and a layer of solder mask. The metal foil layer is patterned to create tracks and lands for solder bonding and/or wirebonding and the layer of solder mask is patterned to create openings for solder bonding, wirebonding and/or for mounting the die. The substrate may be used as a package substrate to create a packaged die or may be used as a replacement for more expensive flexible printed circuit boards.

8 Claims, 7 Drawing Sheets

LOW COST FLEXIBLE SUBSTRATE

BACKGROUND

There are a number of known techniques for packaging die, including Ball Grid Array (BGA), Land Grid Array (LGA) and Quad Flat No-Lead (QFN). BGA and LGA packages use multi-layer organic substrates which are expensive because the manufacturing process is complex and the raw materials costly. The substrates are made from layers of metal with meshed fibre-glass reinforced epoxy core or dielectric. QFN packages are fabricated by attaching the die to a metal leadframe and forming electrical connections between the leadframe and pads on the die using wirebonds. The whole structure is then over molded (or 'over moulded') leaving one face of the leadframe exposed on the base of the QFN package. BGA packages include an array of solder balls which are used to mount the package onto a substrate, such as a printed circuit board (PCB). LGA and QFN packages do not comprise solder balls and are instead mounted on a substrate using solder paste which may be stencil printed onto the substrate.

For pin counts below around 100, QFN packages are lower cost than BGA and LGA packages because of the substitution of a low cost lead frame for the expensive substrate. However, for pin-counts in excess of around 40, QFN packages are larger than a corresponding BGA/LGA package. Additionally, with high pin-counts, both QFN and LGA have a poor yield for the package mounting process because of warpage during solder reflow. The problem is less for BGAs because the molten solder balls can accommodate a degree of warpage.

The embodiments described below are not limited to implementations which solve any or all of the disadvantages of known package substrates and packaging techniques.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A low cost flexible substrate is described which comprises a thin metal foil and a layer of solder mask. The metal foil layer is patterned to create tracks and lands for solder bonding and/or wirebonding and the layer of solder mask is patterned to create openings for solder bonding, wirebonding and/or for mounting the die. The substrate may be used as a package substrate to create a packaged die or may be used as a replacement for more expensive flexible printed circuit boards.

A first aspect provides a substrate comprising a patterned metal foil layer and a patterned layer of solder mask.

The substrate may be flexible.

The substrate may be a package substrate.

The layer of solder mask may be patterned to form openings for wirebonding.

The layer of solder mask may be patterned to form openings for solder bonding.

A second aspect provides a packaged die comprising a substrate as described above, a die attached to the substrate and wherein the substrate and the die are over molded with a molding compound.

The die may be attached to a first face of the substrate and the package may further comprise a plurality of solder balls attached to an opposite face of the substrate, wherein each solder ball is attached to the metal foil layer through an opening in the layer of solder mask.

The die may be attached to the metal foil layer.

A third aspect provides a method of fabricating a substrate comprising: applying a solder mask layer to a metal foil; and patterning the metal foil.

The method may further comprise: patterning the solder mask layer.

A fourth aspect provides a method of packaging a die comprising: bonding a die to a substrate comprising a patterned metal foil layer and a patterned layer of solder mask; and over molding the die and the substrate.

The method may further comprise: forming wirebonds between pads on the die and tracks formed in the patterned metal foil layer.

The method may further comprise: attaching a plurality solder balls to the substrate, each solder ball being attached to the metal foil layer through an opening in the layer of solder mask; and reflowing the solder balls.

Further aspects provide a substrate substantially as described with reference to FIG. 1 of the drawings, a method of making a substrate substantially as described with reference to FIG. 2 of the drawings, a packaged die substantially as described with reference to any of FIGS. 3-6 of the drawings and a method of packaging a die substantially as described with reference to FIG. 7 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
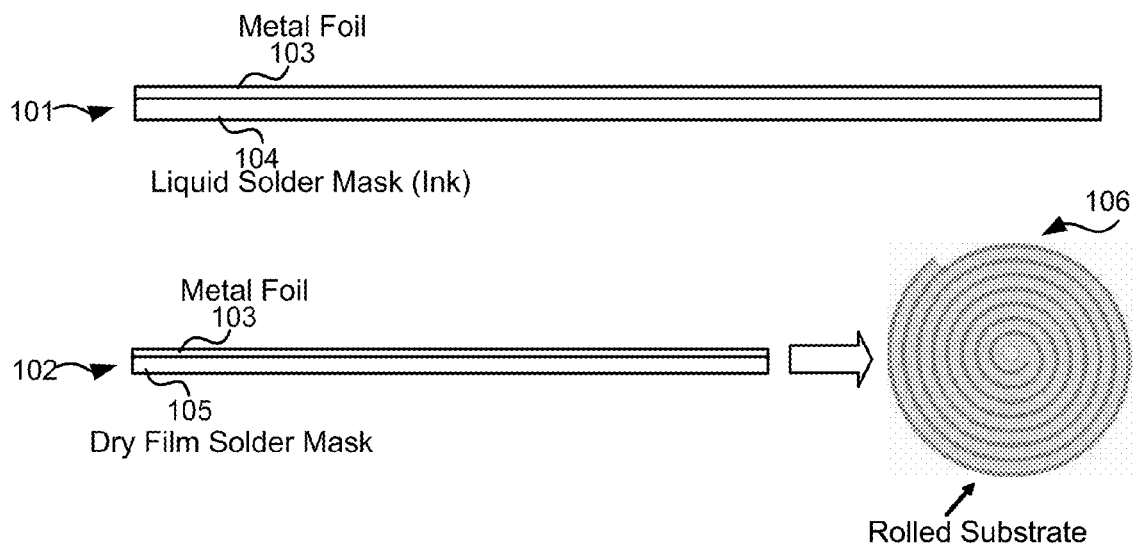
FIG. 1 shows schematic diagrams of two examples of a low cost flexible substrate.

FIG. 1 shows schematic diagrams of two examples 101, 102 of a low cost flexible substrate which may be used in the packaging of die or as a flexible printed circuit board (PCB). The substrate comprises a metal foil 103 and a layer of solder mask 104, 105. The metal foil may be made from any suitable metal and whilst in many examples copper is used, other metals, such as gold or aluminium may be used. One or both faces of the foil may be plated to assist with wirebonding to the foil, e.g. using NiAu, PdAu or electroless nickel. In addition (or instead) one face (e.g. the lower face in the arrangements shown in FIG. 1) may be coated in organic solderability (or solder) preservative (OSP) which prevents oxidation for a period of time (e.g. many months) and enhances the ability to solder to the foil layer 103. Other coatings may alternatively be used. In many applications, the metal foil may be as thin as possible (e.g. 11-18 µm) because this increases the patterning density which can be achieved; however any thickness of metal foil may be used.

The solder mask may be any kind of solder mask including, but not limited to, liquid solder mask 104 (including liquid photoimageable solder mask (LPSM) and screen printable solder mask) and dry film solder mask 105 (including dry film photoimageable solder mask (DFSM)). The solder mask material may be selected and/or optimised according to one or more of the following criteria:

Robustness: i.e. to be sufficiently robust for the required application (e.g. die attach and wirebonding) and such that it does not disintegrate on handling (although a carrier may be used to minimise handling, as described in more detail below);

Adherence to the metal foil; and

Flexibility: i.e. to provide the appropriate flexibility of the substrate for the particular application.

Different materials may be used for different applications and different materials may be suitable for different metal foils. PFR-800 AUS410 (as produced by TAIYO INK MFG. CO. LTD.), a dry film solder mask material with 100% bendability feature, and PSR-4000 AUS320 (as produced by TAIYO INK MFG. CO. LTD.), a liquid solder mask with high Tg (glass transition temperature), are examples of suitable materials. Other examples include: liquid crystal polymer (LCP), but is expensive and difficult to bond to metal foil, PTFE, which is also quite hard to bond to, and polyimide, which may be particularly suited to high frequency applications but is expensive. Dry film solder mask may provide a more flexible substrate than using liquid solder mask and this may enable formation of a rolled substrate 106 or rolled or wrapped PCB board. A rolled substrate 106 may enable reel to reel processing which provides cost reduction and economies of scale.

Where a liquid solder mask 104 is used, the layer may be around 25 µm thick. The thickness may be tailored to a particular application, with thinner layers being less robust but easier to pattern with small features. A similar concept applies to the metallisation layer(s). There are a number of different thicknesses of dry film solder mask 105 which are available, e.g. 20, 25, 30 and 35 µm.

Figure 2:
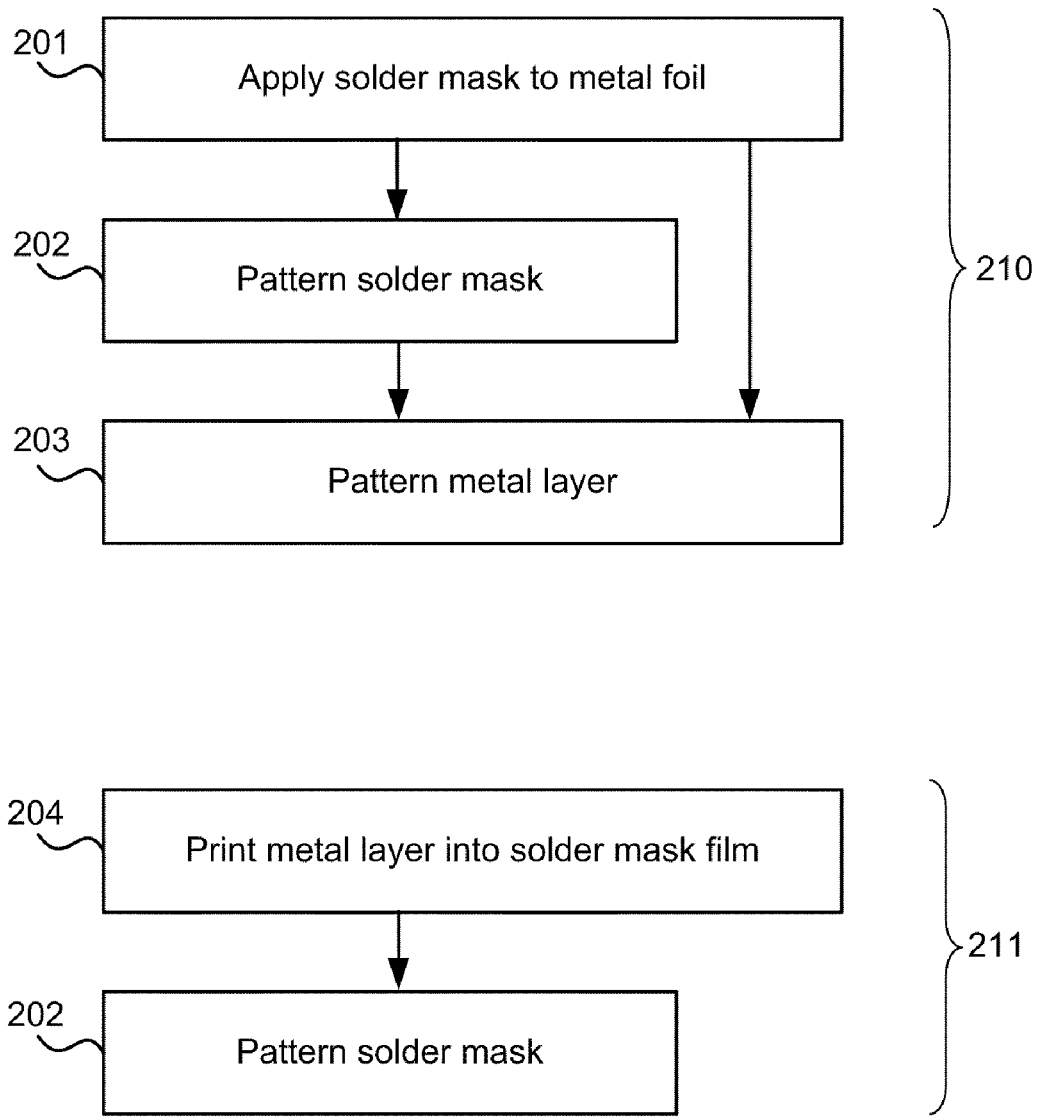
FIG. 2 shows flow diagrams of example methods of fabricating a low cost substrate.

FIG. 2 shows flow diagrams of example methods 210, 211 of fabricating a low cost substrate, such as those shown in FIG. 1. In the first example method 210, a solder mask is applied to a metal foil (block 201) and then, if required, the solder mask is patterned (block 202). Liquid solder mask may be screen printed to realise and pattern the solder mask in a single process step, whilst dry film solder mask may be applied under vacuum (e.g. using a vacuum lamination process) to prevent air bubbles and then subsequently patterned to form openings in the solder mask. Where a separate patterning step (block 202) is used, this may use photolithography, for example by exposing photoimagable solder mask material (e.g. LPSM or DFSM) or using a masking process for non-photoimagable solder mask materials. The metal layer may then be patterned (block 203) using any suitable technique, e.g. using a wet etching process. In an example, a plated layer on the metal foil of the areas of interest (that provides a wire-bondable/solderable finish) may be used as a mask.

In alternative method 211 of fabricating a low cost substrate, the metal layer 103 (e.g. a copper layer) may alternatively be printed onto a dry film solder mask 105 (block 204). This single process step produces a patterned metal layer and the dry film solder mask may subsequently be patterned (block 202 e.g. as described above).

Although the examples shown in FIG. 1 comprise a single metal layer, multilayer substrates may also be fabricated, e.g. by repeating method 210. In an example of such a multilayer substrate, a layer of solder mask may be used to separate metal layers. Silicon devices (e.g. ICs) or other components may, in some examples, be embedded between layers of solder mask. Vias may be formed in the interior solder mask layers and these may, for example, be metallised using solder paste or other electrically conductive material (e.g. metal loaded adhesive). The thin solder mask layer facilitates the use of laser vias.

The low cost substrates described above are lower cost than existing substrates, e.g. BGA substrates, due to the materials used and the reduction in the number of process steps required to make the substrates. The substrates are also thin, which enables assembly of low profile packaged die (as described in more detail below) and flexible, which may be useful in subsequent processing and/or in the ultimate application in which the substrate is used. The substrates are also more environmentally friendly, as they do not use fibre-glass, and have low moisture absorption. It may be possible to obtain a moisture sensitivity level (MSL) of one using the substrates described above (compared to a typical value of MSL=3 for BGA packages), which means that the packages do not require special storage conditions (e.g. storage in a sealed bag) and/or bakes to remove moisture prior to reflow.

There are many different applications for the low cost substrates described above; for example they may be used to create packaged die (as described in more detail below) or they may be used to replace existing expensive polyimide flexible PCBs (e.g. for hinge joints or sliding mechanisms in consumer electronic devices, such as mobile telephones, or for providing electrical connections to moving parts, such as print heads). In another application, they may be 20 used to create new components, e.g. antennas (FM radio, Bluetooth, WiFi etc) which may be rolled up to reduce the space occupied on a PCB.

Figure 3:
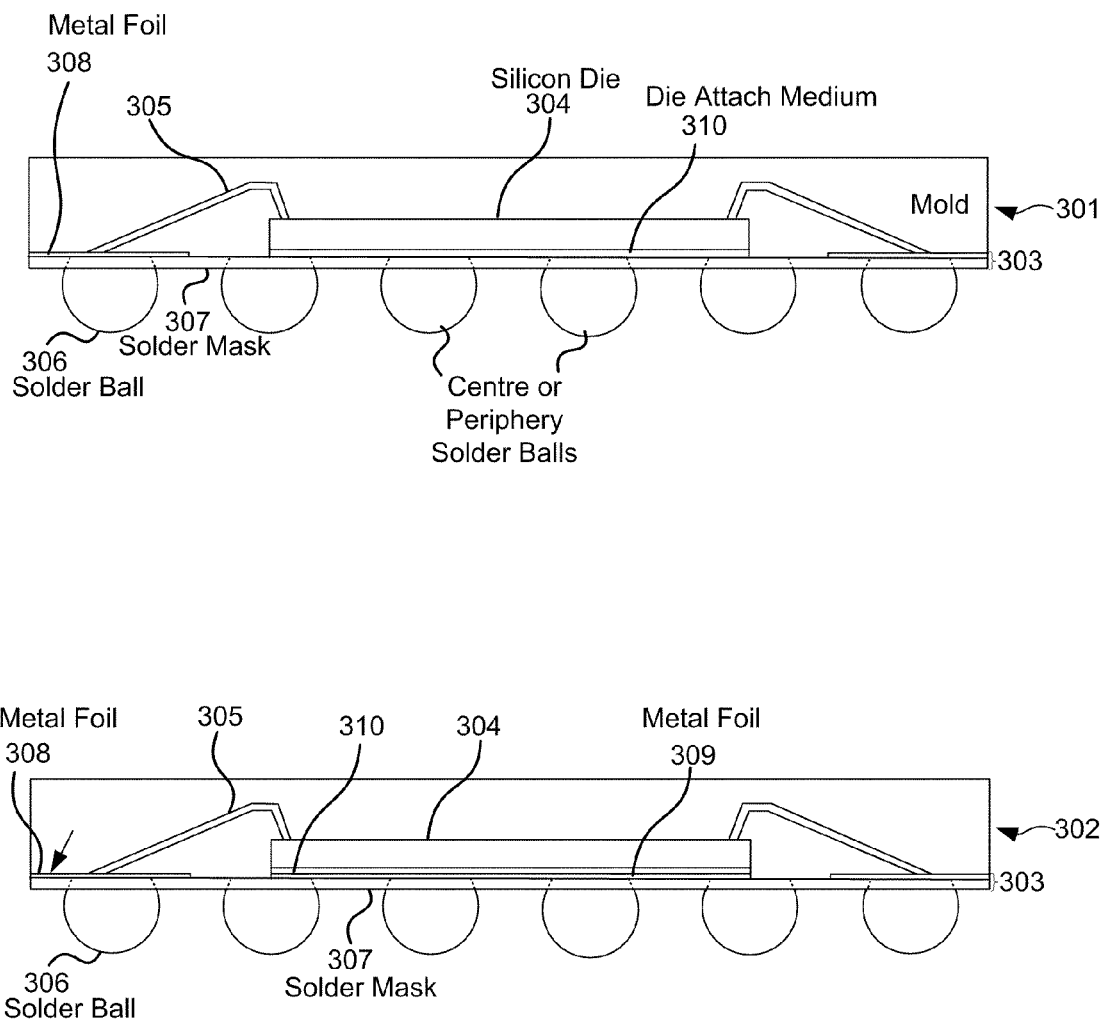
FIGS. 3-6 show schematic diagrams of examples of packages which use a low cost substrate such as shown in FIG. 1.

FIG. 3 shows two examples 301, 302 of a BGA package which uses a low cost substrate 303, as described above. The die 304 is attached to the substrate 303 and the rest of the packaging process is similar to standard BGA packaging, with the die being wirebonded to the substrate (wirebond 305) and the whole assembly being over molded. Solder balls 306 are then placed and reflowed. As with standard BGA assembly, multiple die may be mounted on a substrate which may be diced into individual packages after molding and after the solder balls have been reflowed. The patterning of the solder mask 307 (e.g. in block 202 of FIG. 2) opens areas which expose the underside of the metal foil 308 and form solder lands where the solder balls 306 can be attached. As in standard BGA packaging, these openings may be around the periphery of the package. The difference between the two examples shown in FIG. 3 is that in the first example 301, the die 304 is attached directly to the solder mask 307, whilst in the second example 302, the die 304 is attached to an area 309 of the metal foil. Any suitable die attach material 310 may be used, e.g. adhesive.

Figure 4:
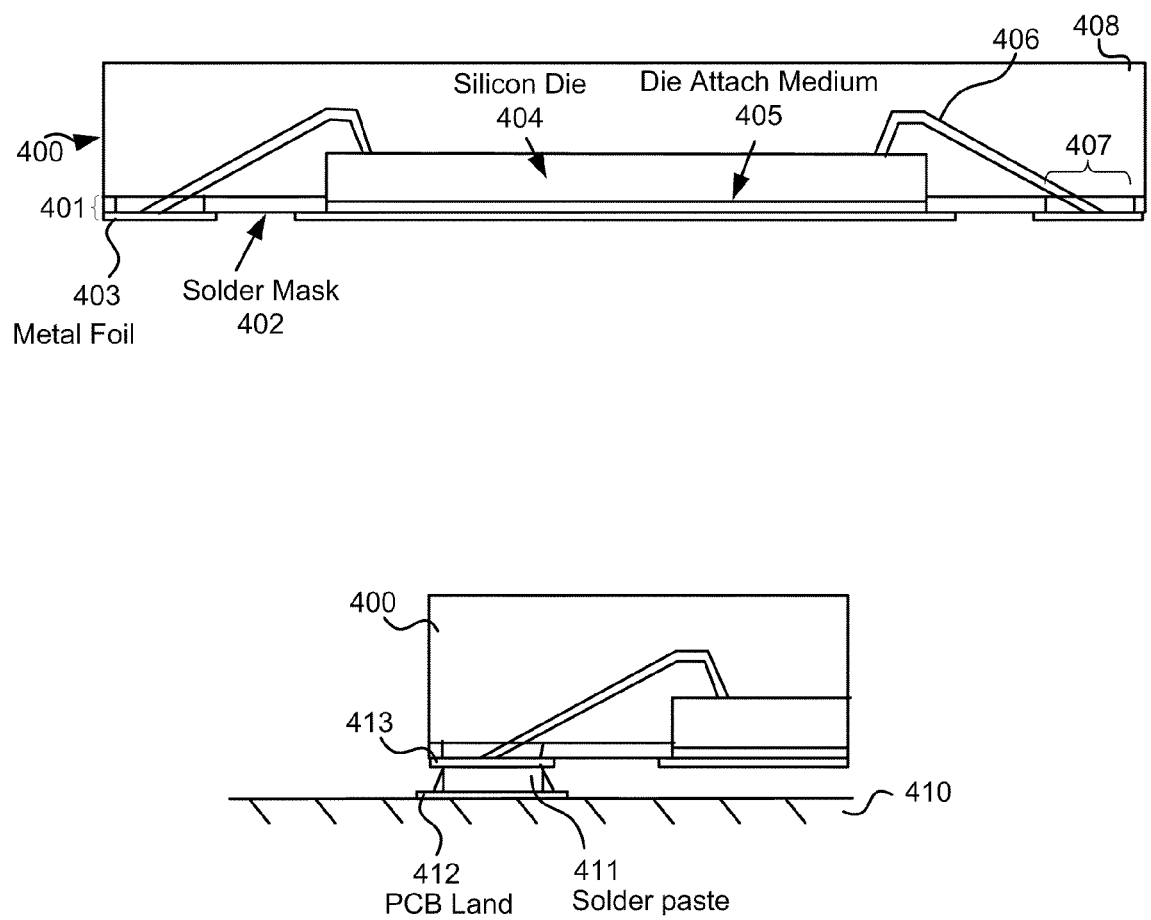
Figure 5:
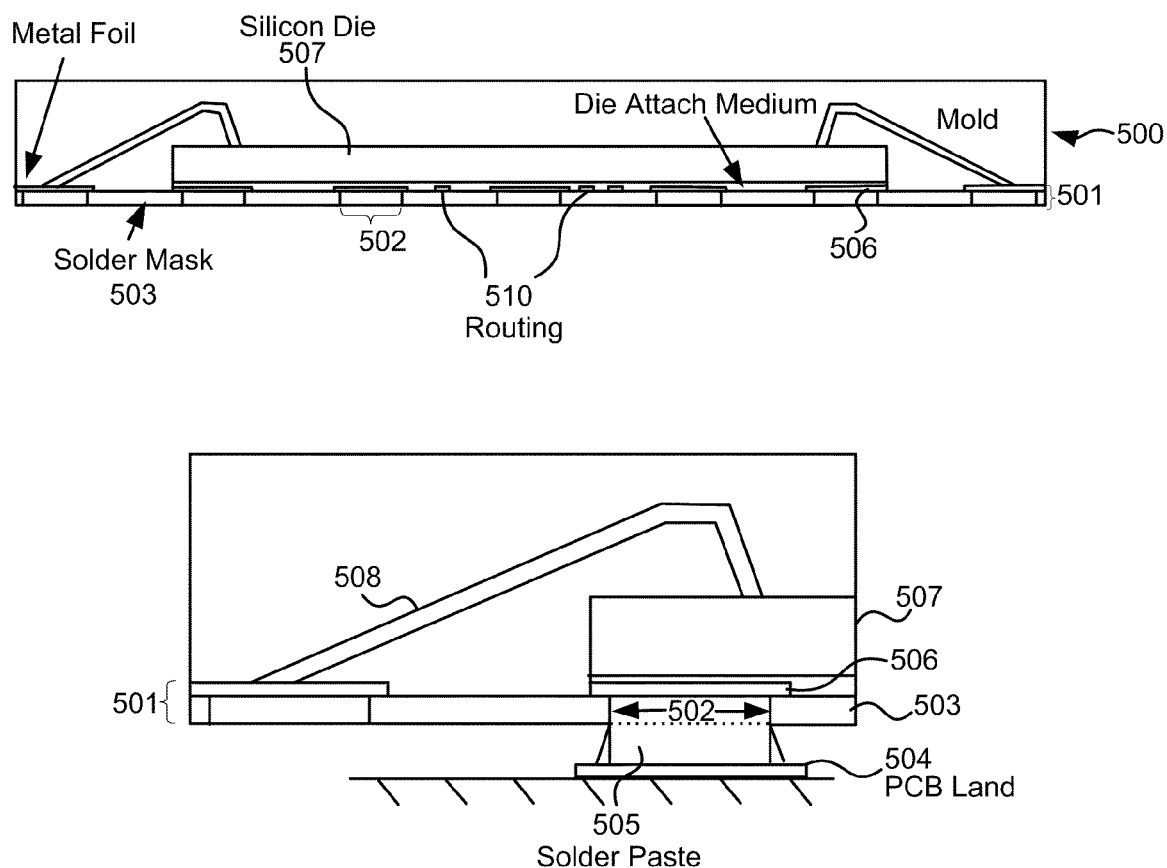

In a variation of the examples shown in FIG. 3, the solder balls 306 maybe omitted so as to create a LGA package (e.g. as shown in FIGS. 4 and 5).

FIG. 4 shows an example of a QFN package 400 which uses a low cost substrate 401, as described above. Compared to the previous examples, (shown in FIG. 3), the substrate is inverted such that the solder mask 402 is the top side. In this example, openings in the solder mask (e.g. as formed in block 202 of FIG. 2) expose areas of the metal foil 403 for wirebonding. In some examples, additional areas may be exposed to increase the robustness of the packaged die, as mechanical stability is increased if there is an increased area for the molding compound 408 to adhere to the metal foil 403. The die 404 is attached to the substrate 401 using die attach material 405 (e.g. adhesive) before wirebonds 406 are formed between pads on the die and the exposed areas 407 of the metal foil. The whole assembly is then over molded. As with standard QFN packaging, multiple die may be attached to the substrate and the resultant over molded assembly may then be separated into individual packaged die (e.g. by punching or sawing).

In the example shown in FIG. 4, the die is attached to the metal foil 403 through an opening in the solder mask layer. This may provide a good thermal path between the die and the substrate (if the die attach material (medium) 405 is thermally conductive). Additionally, this may provide an electrical ground connection (e.g. if there is wirebond from the top of the chip to this region of the metal foil). Furthermore, by mounting the die in such an opening, the overall height of the package die is reduced. In an alternative arrangement to that shown in FIG. 4, the die may be attached to the solder mask layer.

The package 400 may be soldered onto a PCB 410 as also shown in FIG. 4. Solder paste 411 may be screen printed onto the PCB 410 (e.g. onto solder lands 412 on the PCB). With this package 400, the lands on the package 413 are non solder mask defined (NSMD).

Although the QFN package 400 is only shown as having a single row of lands, the use of a low cost substrate as described above, facilitates the manufacture of multi-row QFN packages. This is because the metal foil layer is thin and therefore easy to pattern and all the lands are supported on the solder mask.

FIG. 5 shows another example of a package 500 which uses a low cost substrate 501, as described above. This package 500 may be a QFN or LGA package and uses the solder mask openings 502 (in the solder mask layer 503) as a solder paste limiter and shape controller, i.e. the package comprises solder mask defined lands. This is shown in the second view in FIG. 5, which shows a PCB land 504 and solder paste SOS which is limited to the opening 502 in the solder mask 503. In the example shown in FIG. 5, there are only small areas 506, 510 of metal foil underneath the die 507 and these correspond to the positions of the openings 502 in the solder mask and any routing between the lands 510. This provides greater flexibility in routing tracks underneath the die, compared with a single large area of copper, because solder will not wet further than the solder mask defined land.

Figure 7:
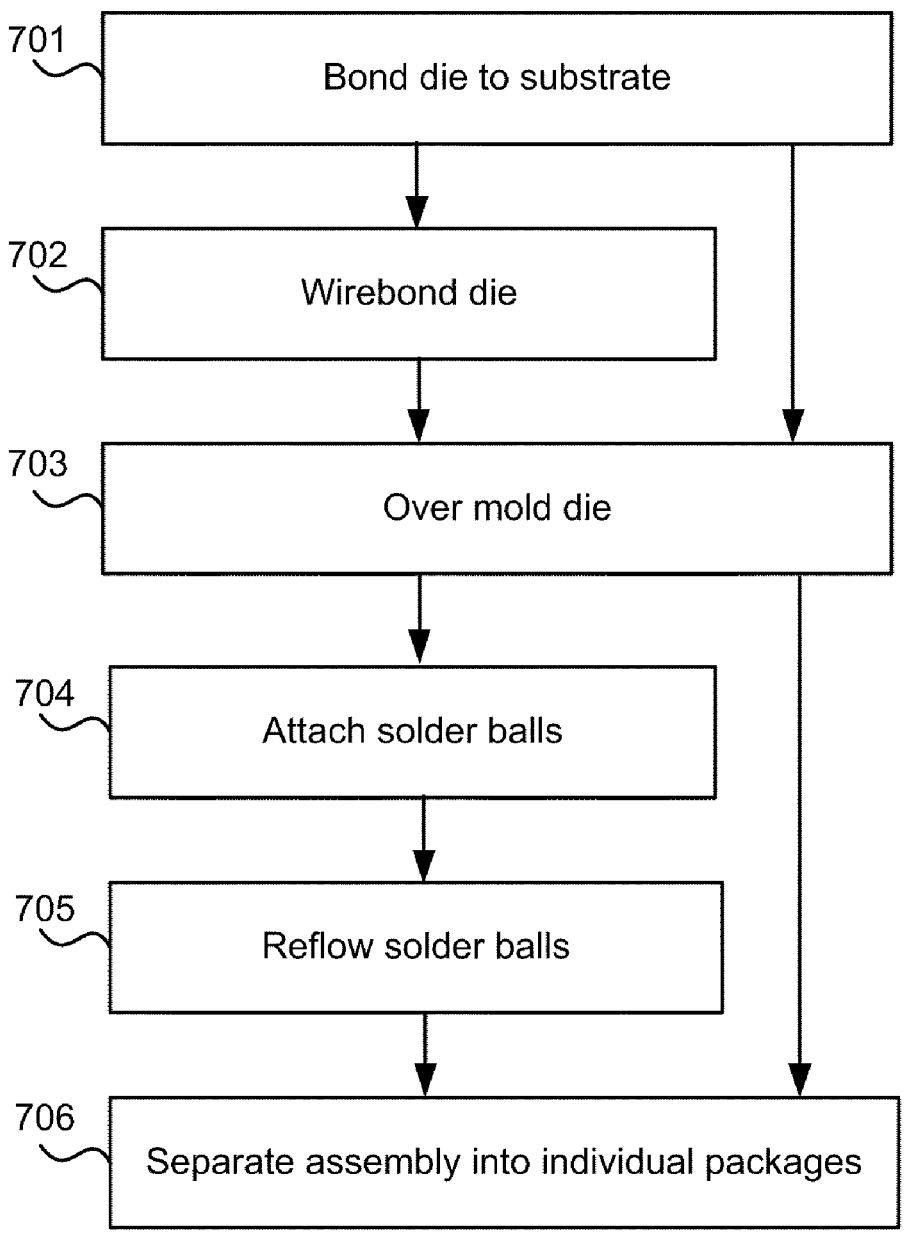
FIG. 7 is a flow diagram of an example method of fabrication of a packaged die. Common reference numerals are used throughout the figures to indicate similar features.

In some of the examples described above, the low cost substrate may be mounted on a carrier before the die is bonded to the substrate (e.g. the substrate may be laminated on a carrier). An example of a suitable carrier is dicing tape or support film (also referred to as Nitto film). In a further variation, the solder mask may not be used, but instead the metal foil may be laminated onto the carrier and patterned (or printed onto the carrier). The die/package assembly (e.g. as shown in FIG. 7) may then be performed before the carrier is removed.

In the examples above, any suitable die attach material may be used. Examples include non-electrically conductive adhesives, anisotropic conductive adhesive (ACA) Similarly whilst the examples described herein show solder being used to attach the packaged die to the PCB, any suitable material may be used (e.g. ACA or electrically conductive adhesives).

Figure 6:
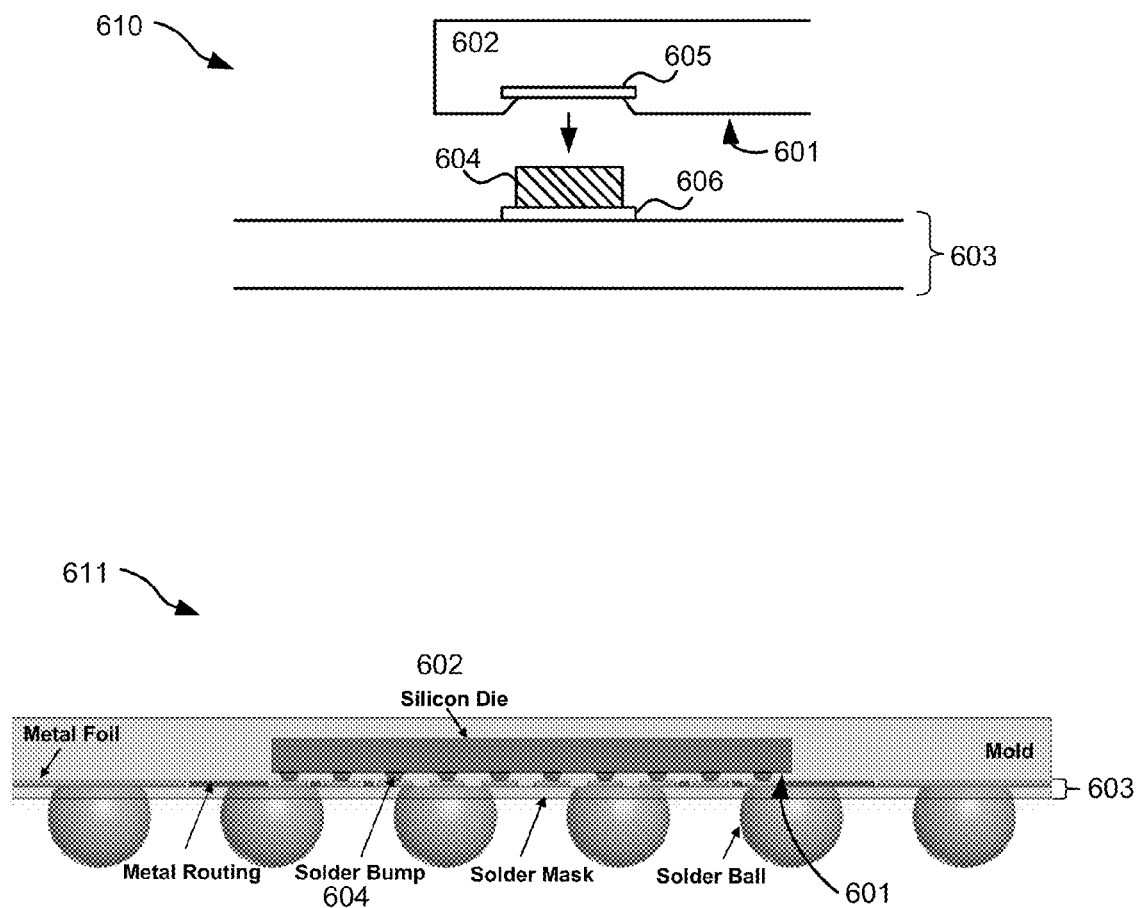

The examples shown in FIGS. 3-5 all use wirebonds 305, 406, 508 to form the electrical connections between the pads on the die and the low cost substrate 303, 401, 501. In further examples, the die may be attached to the substrate using flip-chip bonding, as shown in FIG. 6. Flip-chip bonding is enabled by the high track density which can be achieved in the low cost substrate (e.g. due to the thin metal foil) and as a result a pad pitch below 80 μm can be achieved which matches the pad pitch of many flip-chip compatible die. In such an example, the die is inverted (compared to the examples shown in FIGS. 3-5) such that the active face 601 of the die 602 is towards the low cost substrate 603 and solder paste 604 or solder balls (or bumps) may be used to bond the die to the low cost substrate. The first example 610 in FIG. 6 shows only a portion of the die 602 comprising a single pad 605 which is aligned to the solder paste 604 and a region of the metal foil layer 606 on the low cost substrate 603. The second example 611 shows the entire die 602 flip-chipped onto the low cost substrate.

If flip-chip bonding is used, the die may be a flip-chip compatible die, or alternatively the pads on the die may need to be plated to ensure that the solder wets to the die or the solder may be selected for compatibility with the metallisation on the die. In further examples, thermal compression bonding or ACA bonding may be used instead.

Whilst the examples of packaged die shown in FIG. 3-5 are described as being soldered onto a PCB or other substrate (as shown in FIGS. 4 and 5), the packaged die may alternatively be attached to a substrate and wirebonded. In further examples, vias may be omitted by using a single-sided double-access design; multiple layers may be achieved using solder paste and standard reflow processes; and if the substrate is left unmolded, the substrate may be used to form a flexible PCB.

FIG. 7 is a flow diagram of an example method of fabrication of a packaged die, such as shown in FIGS. 3-6 and described above. The die is bonded to the substrate (block 701) and then, if the die has not been flip-chip bonded, the die is wirebonded (block 702). The die is then over molded (block 703) using a molding compound. If the package is a BGA package, solder balls are then attached (block 704) and reflowed (block 705). The completed assembly is then diced (or punched, e.g. in the case of punched QFN) into individual packages (block 706).

The packages assembled using the low cost substrate described above (e.g. as shown in FIGS. 3-6) are lower cost than conventional BGA and LGA packages. The packages assembled using low cost substrate are thinner (i.e. have a reduced height) and are suitable for high pin counts and/or high pin densities (e.g. due to the high patterning density which can be achieved with a thin metal foil and/or by fanning tracks underneath the die). The overall package size may also be reduced as a result of the high pin count I pin density that can be achieved. The techniques described are very versatile and can be used for many different types of packages, including, but not limited to BGA, LGA, Fan out/in WLCSP and QFN packages. The packages have low moisture absorption (e.g. because of the absence of fibre-glass and because of a reduced number of layers) and are more environmentally friendly (e.g. because they do not contain fibre glass and also because they can be more easily recycled as they comprise fewer materials than a standard PCB). Where solder mask defined lands are used (e.g. as shown in FIG. 5), any non-uniformity in the package and PCB can be accommodated since the solder paste is contained within the solder mask opening.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A method of packaging a die comprising:
   bonding a die to a flexible substrate comprising a patterned metal foil layer and a patterned layer of solder mask, the solder mask comprising one of a liquid solder mask and a dry film solder mask; and
   over molding the die and the flexible substrates;
   wherein the die is attached to the patterned metal foil layer through an opening in the patterned layer of solder mask.

2. The method according to claim 1, further comprising:
   forming wirebonds between pads on the die and tracks formed in the patterned metal foil layer.

3. The method according to claim 1, further comprising:
   attaching a plurality solder balls to the flexible substrate, each solder ball being attached to the metal foil layer through an opening in the layer of solder mask; and
   reflowing the solder balls.

4. The method according to claim 1, wherein the solder mask comprises a dry film solder mask.

5. The method according to claim 4, wherein the patterned layer of solder mask has a thickness selected from 20 µm, 25 µm, 30 µm and 35 µm.

6. The method according to claim 1, wherein the solder mask comprises a liquid solder mask and the patterned layer of solder mask is approximately 25 µm thick.

7. The method according to claim 1, further comprising repeating the method to form a multilayer substrate and forming vias in interior solder layers.

8. The method according to claim 1, further comprising applying the solder mask layer to the metal foil layer and patterning the metal foil.

* * * * *

UNITED STATES PATENT AND TRADEMARK OFFICE
CERTIFICATE OF CORRECTION

| | | |
|---|---|---|
| PATENT NO. | : 8,187,922 B2 | Page 1 of 1 |
| APPLICATION NO. | : 12/557896 | |
| DATED | : May 29, 2012 | |
| INVENTOR(S) | : Zaid Aboush et al. | |

It is certified that error appears in the above-identified patent and that said Letters Patent is hereby corrected as shown below:

In Column 2, Line 7, delete "farther" and insert -- further --, therefor.

In Column 4, Line 37, delete "be 20 used" and insert -- be used --, therefor.

In Column 5, Line 15, delete "example." and insert -- example --, therefor.

in Column 5, Line 43, delete "SOS" and insert -- 505 --, therefor.

In Column 6, Line 56, delete "count I pin" and insert -- count/pin --, therefor.

In Column 8, Line 7, in Claim 1, delete "substrates;" and insert -- substrate; --, therefor.

Signed and Sealed this
Eleventh Day of September, 2012

David J. Kappos
*Director of the United States Patent and Trademark Office*